US012537449B2

United States Patent
Kanjavalappil Raveendranath et al.

(10) Patent No.: US 12,537,449 B2
(45) Date of Patent: Jan. 27, 2026

(54) BOOST CONVERTER WITH FREQUENCY SCALING

(71) Applicant: TEXAS INSTRUMENTS INCORPORATED, Dallas, TX (US)

(72) Inventors: Rejin Kanjavalappil Raveendranath, Bangalore (IN); Manojit Chakraborty, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 18/524,239

(22) Filed: Nov. 30, 2023

(65) Prior Publication Data
US 2024/0297583 A1    Sep. 5, 2024

(30) Foreign Application Priority Data
Mar. 2, 2023  (IN) .............................. 202341014032

(51) Int. Cl.
| | |
|---|---|
| *H02M 3/157* | (2006.01) |
| *H02M 1/14* | (2006.01) |
| *H03F 3/183* | (2006.01) |
| *H04R 3/00* | (2006.01) |

(52) U.S. Cl.
CPC .............. *H02M 3/157* (2013.01); *H02M 1/14* (2013.01); *H03F 3/183* (2013.01); *H03F 2200/03* (2013.01); *H04R 3/00* (2013.01)

(58) Field of Classification Search
CPC ........ H02M 3/157; H02M 1/14; H02M 3/156; H02M 1/0025; H03F 3/183; H03F 2200/03; H04R 3/00
See application file for complete search history.

(56) References Cited

U.S. PATENT DOCUMENTS

| | | | |
|---|---|---|---|
| 9,722,490 B2* | 8/2017 | Archibald ................. | G06F 1/26 |
| 10,609,477 B1 | 3/2020 | Chadha et al. | |
| 10,720,835 B2* | 7/2020 | King ..................... | H02M 3/157 |
| 12,231,028 B2* | 2/2025 | Mei ........................ | H02M 1/08 |
| 2020/0021256 A1* | 1/2020 | Terwal ................... | H03F 3/185 |
| 2020/0049742 A1* | 2/2020 | Sato ...................... | H02M 3/157 |
| 2020/0112250 A1 | 4/2020 | Kanjavalappil Raveendranath et al. | |
| 2022/0149732 A1* | 5/2022 | Zanchi ................. | H02M 3/158 |
| 2022/0224230 A1* | 7/2022 | Chakkirala ........... | H02M 3/158 |
| 2023/0246549 A1* | 8/2023 | Davis-Marsh .......... | H02M 1/15 323/271 |

* cited by examiner

*Primary Examiner* — David L Ton
(74) *Attorney, Agent, or Firm* — Mandy Barsilai Fernandez; Frank D. Cimino

(57) ABSTRACT

A circuit including a digital-to-analog converter (DAC) having a first terminal and a second terminal. The circuit also includes a first diode having a first terminal coupled to the second terminal of the DAC and having a second terminal coupled to the first terminal of the DAC. A comparator has a first terminal and a second terminal. A second diode has a first terminal coupled to the second terminal of the DAC and has a second terminal coupled to the second terminal of the comparator. A voltage-to-current converter (V2I) has a terminal. A resistor has a first terminal coupled to the second terminal of the second diode and has a second terminal coupled to the terminal of the V2I converter.

21 Claims, 9 Drawing Sheets

BOOST CONVERTER WITH FREQUENCY SCALING

CROSS-REFERENCE TO RELATED APPLICATIONS

This application claims priority to India Provisional Application No. 202341014032, filed Mar. 2, 2023, entitled "Analog Based Boost Output Power Detection for Dynamic Frequency Scaling," which is hereby incorporated by reference.

BACKGROUND

Some audio systems include a class D amplifier which receives control signals from an audio controller and converts the control signals into an audio signal to drive a speaker. Some audio systems have a relatively low voltage power source. For example, a mobile device such as cell phone may be powered by a battery, e.g., 3.6V. To provide sufficient power to the class D amplifier to generate higher magnitude audio through the speaker, some audio systems may also include a boost converter to boost the relatively low supply voltage, e.g., battery voltage in a mobile device, to a higher voltage to power the class D amplifier.

SUMMARY

In one example, a circuit including a digital-to-analog converter (DAC) having a first terminal and a second terminal. The circuit also includes a first diode having a first terminal coupled to the second terminal of the DAC and having a second terminal coupled to the first terminal of the DAC. A comparator has a first terminal and a second terminal. A second diode has a first terminal coupled to the second terminal of the DAC and has a second terminal coupled to the second terminal of the comparator. A voltage-to-current converter (V2I) has a terminal. A resistor has a first terminal coupled to the second terminal of the second diode and has a second terminal coupled to the terminal of the V2I converter.

In another example, a boost converter includes a power stage having a power stage input, a pulse width modulation (PWM) generator having a PWM input, a PWM clock input, and a PWM output. The PWM output is coupled to the power stage input. A comparator has a first input, a second input, and an output. The output of the comparator is coupled to the PWM input. A current threshold generator has a current threshold output coupled to the first input of the comparator. A clock boost circuit has a clock output coupled to the PWM clock input. The clock boost circuit is configured to cause an increase of a frequency of a clock signal at the clock output responsive to a determination that a magnitude of a power delivered by the boost converter has exceeded a threshold.

In yet another example, an audio system includes an audio amplifier having a first terminal and a second terminal and a peak current mode boost converter. The peak current mode boost converter has a first terminal coupled to the first terminal of the audio amplifier. The peak current mode boost converter is configured to: generate a clock at a first frequency, determine that a power draw by the audio amplifier is above a threshold, and, responsive to the determination that the power draw is above the threshold, increase the frequency of the clock from the first frequency to a second frequency.

DETAILED DESCRIPTION

Figure 1:
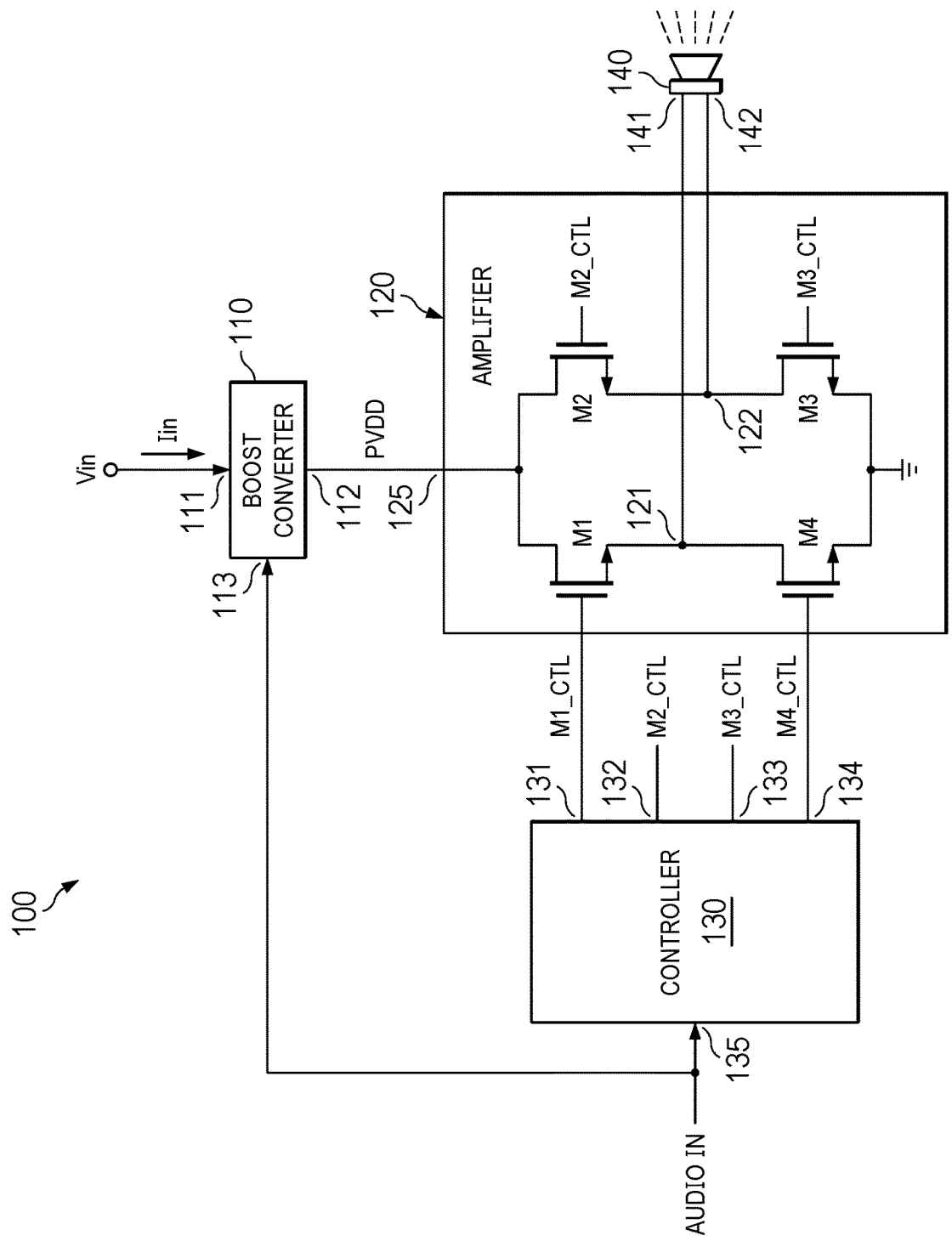
FIG. 1 is a schematic diagram of an audio system including a boost converter, in an example.

The same reference numbers or other reference designators are used in the drawings to designate the same or similar (either by function and/or structure) features.

FIG. 1 is a schematic diagram of an audio system 100, in an example. Audio system 100 includes a boost converter 110, an amplifier 120, a controller 130, and a speaker 140. Although amplifier 120 can be any suitable type of audio amplifier, in this example, amplifier 120 is a class D amplifier. Amplifier 120 includes transistors M1, M2, M3, and M4. Transistors M1-M4 are n-channel field effect transistors (NFETs) in this example but can be other types of transistors in other examples. The inputs to amplifier 120 are the gates of transistors M1-M4, which are coupled to corresponding output terminals 131, 132, 133, and 134 of controller 130. Output terminal 131 is coupled to the gate of transistor M1. Output terminal 132 is coupled to the gate of transistor M2. Output terminal 133 is coupled to the gate of transistor M3. Output terminal 134 is coupled to the gate of transistor M4. The source of transistor M1 is coupled to the drain of transistor M4 and provides an output terminal 121 of amplifier 120. Similarly, the source of transistor M2 is coupled to the drain of transistor M3 and provides the other output terminal 122 of amplifier 120. Speaker 140 has terminals 141 and 142 which are coupled to respective output terminals 121 and 122 of amplifier 120.

Boost converter 110 has an input voltage terminal 111, an output voltage terminal 112, and an audio input terminal 113. An input voltage Vin is provided to the input voltage terminal 111. The output voltage terminal 112 of boost converter 110 is coupled to an input supply voltage terminal 125 of amplifier 120. Boost converter 110 converts the input voltage Vin to an output voltage, PVDD, at its output voltage terminal 112. Accordingly, voltage PVDD is provided to amplifier 120 to power the amplifier.

Controller 130 also has an audio input terminal 135. An audio input signal, AUDIO IN, is provided to the audio input terminal 135 of controller 130 and to the audio input terminal 113 of boost converter 110. Controller 130 generates control signals M1_CTL, M2_CTL, M3_CTL, and M4_CTL at its corresponding output terminals 131-134 based on AUDIO IN. Controller 130 may include a digital-to-analog converter DAC) whose output is coupled to an input of a pulse width modulator to convert the analog output to pulses as signals M1_CTRL, M2_CTRL, M3_CTRL, and M4_CTRL.

Based on the logic levels of control signals M1_CTL, M2_CTL, M3_CTL, and M4_CTL, amplifier 120 has three phases of operation. In a first phase, with control signals M1_CTL and M3_CTL being logic high and control signals M2_CTL and M4_CTL being logic low, transistors M1 and M3 are on and transistors M2 and M4 are off. In a second phase, with control signals M2_CTL and M4_CTL being logic high and control signals M1_CTL and M3_CTL being logic low, transistors M2 and M4 are on and transistors M1 and M3 are off. In a third phase, with control signals M3_CTL and M4_CTL being logic high and control signals M1_CTL and M2_CTL being logic low, transistors M3 and M4 are on and transistors M1 and M2 are off. In another example, in the third phase, transistors M1 and M2 may be on and transistors M3 and M4 may be off.

With transistors M1 and M3 on, relative to ground the voltage at output terminal 121 is PVDD and the voltage at output terminal 122 is ground (0V). Accordingly, the voltage of speaker terminal 141 relative to speaker terminal 142 is PVDD. With transistors M2 and M4 on, the voltage at output terminal 121 is 0V and the voltage at output terminal 122 is PVDD. Accordingly, the voltage of speaker terminal 141 relative to speaker terminal 142 is-PVDD. With transistors M3 and M4 on, or transistors M1 and M2 on, the voltage difference between at output terminals 121 and 122 is 0V.

As will be further described below, boost converter 110 includes a power stage that includes, among other components, an inductor and a transistor. When the transistor is turned on, energy is stored in the inductor and the inductor current, which also is the boost converter's input current (Iin), increases linearly. When the transistor is turned off, the inductor's current decreases linearly. In the example described herein, boost converter 110 is a peak current mode control boost converter in which its inductor's current is compared to a peak reference current (I_LIM_REF). When the inductor current reaches the peak current threshold, the converter turns off the transistor. Accordingly, the inductor's current ramps up and down between the peak reference current, I_LIM_REF, and a lower current level. The peak-to-peak current difference of the inductor current is Iripple. The average inductor current, Iin_ave, is:

$$\text{Iin\_ave} = \text{I\_LIM\_REF} - \frac{Iripple}{2} \quad \text{(Eq. 1)}$$

In the example of a mobile device, e.g., cellular telephone, tablet device, etc., the input voltage Vin may be supplied by the device's battery. The voltage of a mobile device's battery may be relatively small, e.g., 3.6V. The power delivered by boost converter 110 is a function of its input power. The input power, Pin, to boost converter 110 is the product of its input voltage, Vin, and the average input current, Iin_ave. The output power, Pout, from boost converter is Pin*Keff, where Keff represents the efficiency factor for the boost converter. For example, if Keff is 0.9 (90% efficient), Pout=Pin*0.9. Based on Eq. 1, the output power Pout from boost converter 110 is:

$$Pout = Vin * \left( \text{I\_MAX} - \frac{Iripple}{2} \right) * Keff \quad \text{(Eq. 2)}$$

The switching frequency of boost converter 110 is Fsw. At higher switching frequencies, the ripple current Iripple is lower, and at lower switching frequencies, Iripple is higher. Based on Eq. 2, lower levels of Iripple results in higher levels of output power, Pout. However, higher switching frequencies also means an increase in switching losses within the boost converter. The examples described herein advantageously operate boost converter 110 to implement a lower switching frequency when the power draw needs of amplifier 120 are consistent with lower volume audio and to increase the switching frequency when the power draw needs of amplifier 120 are consistent with higher volume audio, thereby supplying the power demands of amplifier 120 in a power efficient manner.

Figure 2:
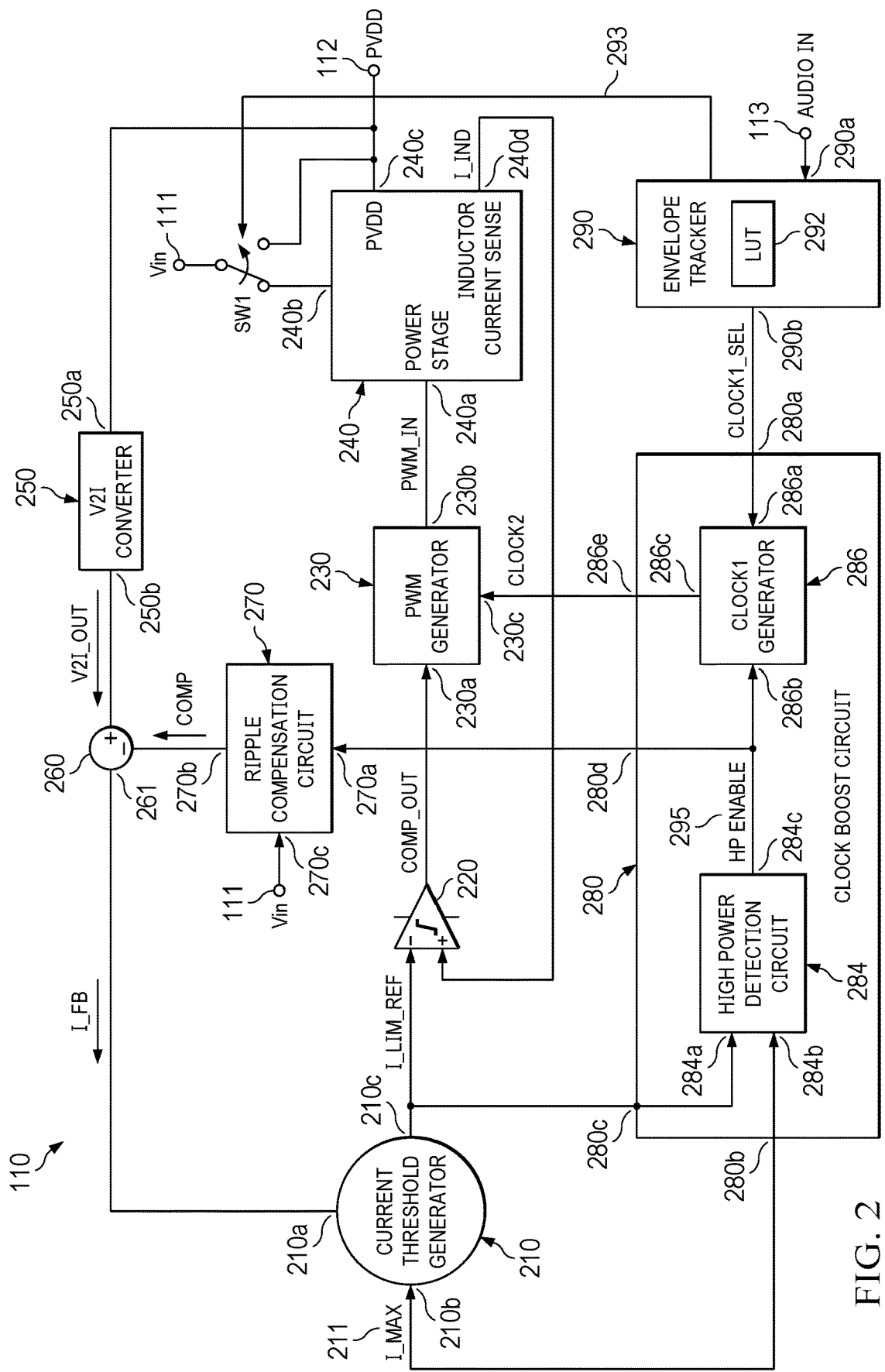
FIG. 2 is a block diagram of the boost converter of FIG. 1, in an example.

FIG. 2 is a block diagram of boost converter 110. In this example, boost converter 110 includes a current threshold generator 210, a comparator 220, a pulse width modulator (PWM) 230, a power stage 240, a voltage-to-current (V2I) converter 250, a summer 260, a ripple compensation circuit 270, a clock boost circuit 280, and an envelope tracker 290. Power stage 240 has an input 240a, an input 240b coupled to the input voltage terminal 111, an output 240c coupled to the output voltage terminal 112, and an inductor current sense output 240d. At low amplitude levels of the audio signal, boost converter 110 may not be needed to provide a boosted voltage PVDD to amplifier 120. Bypass switch SW1 may be included to provide Vin directly to amplifier 120 as PVDD. Switch SW1 is controlled by a control signal 293 from envelope tracker 290, which determines an envelope of the audio input signal AUDIO IN. With switch SW1 in the state shown in FIG. 2, VIN is provided to power stage 240, and the power stage provides a boosted voltage PVDD that is greater than VIN to amplifier 120. In the other switch state, VIN is coupled directly to PVDD. When envelope tracker 290 determines that the envelope of AUDIO IN is below a threshold, the envelope tracker asserts control signal 294 to a logic state to change the state of switch SW1 to couple VIN to output voltage terminal 112. The power stage's output 240c is coupled to an input 250a of V2I converter 250. The V2I converter 250 has an output 250b coupled to an input (+) of summer 260. Ripple compensation circuit 270 has an output 272 coupled to an input (−) of summer 260. The output 261 of summer 260 is coupled to an input 210a of current threshold generator 210. An input 210b of current threshold generator is configured to receive a value indicative of the maximum current (I_MAX) 211 that the boost converter is to allow through the inductor of its power stage 240. Output 210c of current threshold generator 210 is coupled to the negative (−) input of comparator 220. Inductor current sense output 240d of power stage 240, which provides a signal I_IND indicative of the current through the inductor of the power stage, is coupled to the positive (+) input of comparator 220. The output of comparator 220 is coupled to an input 230a of PWM generator 230. The output 230b of PWM generator 230 is coupled to the input 240a of power stage 240.

Envelope tracker 290 has an input 290a and an output 290b. Input 290a is coupled to the audio input terminal 113. Clock boost circuit 280 has inputs 280a, 280b, and 280c and outputs 280d and 280c. Output 290b of envelope tracker 290 is coupled input 280a. The input 280b is configured to receive the value indicative of the maximum current I_MAX

211. Output 210*c* of current threshold generator 210 is coupled to input 280*c*. Output 280*d* is coupled to an input 270*a* of ripple compensation circuit 270, and output 280*e* is coupled to an input 230*c* of PWM generator 230.

In one example, envelope tracker 290 is implemented in machine code executed on a processor and current threshold generator 210, comparator 220, PWM generator 230, power stage 250, V2I converter 250, summer 260, ripple compensation circuit 270, and clock boost circuit 280 are implemented as analog circuits. As described below, envelope tracker 290 determines the envelope of the audio input signal AUDIO IN. Envelope tracker 290 may have a look-up table (LUT) 292 which maps various ranges of audio input signal amplitude to corresponding switching frequencies. Envelope tracker 290 generates an output clock selection signal, CLOCK1_SEL, which corresponds to a frequency of a clock signal CLOCK1 using the magnitude of the envelope of the audio input signal as an index into the LUT 292. CLOCK1_SEL is provided to an input 286*a* of clock generator 286 (described below), which causes clock generator to output CLOCK1 at the frequency corresponding to CLOCK1_SEL. In one example, envelope tracker 290 generates CLOCK1_SEL to cause clock generator 286 to generate a higher frequency clock signal CLOCK1 for higher levels of the envelope of the audio input signal AUDIO IN.

The clock selection signal CLOCK1_SEL is provided to input 280*a* of clock boost circuit 280. Clock boost circuit 280 includes a high power detection circuit 284 coupled to clock generator 286. High power detection circuit 284 includes inputs 284*a* and 284*b* coupled to the respective inputs 280*b* and 280*c*. High power detection circuit 284 includes an output 284*c* which is coupled to input 286*b* of clock generator 286 and to input 270*a* of rippler compensation circuit 270. High power detection circuit 284 generates an output signal HP ENABLE 295 at its output 284*c* as described below. Clock generator 286 has an input 286*a* that is coupled to input 280*a* and has an output 286*c* that is coupled to output 280*c*.

Clock boost circuit 280 generates its output clock signal CLOCK2 at its input 286*c* to PWM generator 230 to have a frequency corresponding to the clock selection signal CLOCK1_SEL or produces an output clock CLOCK2 at a higher frequency than otherwise indicated by CLOCK1_SEL. As described below, high power detection circuit 284 determines whether the power demand on boost converter 110 is within a threshold of its maximum output power capability. If power detection circuit 284 determines that the power demand on boost converter 110 is not within the threshold of its maximum output power capability, clock boost circuit 280 causes its output clock CLOCK2 to have the frequency corresponding to CLOCK1_SEL. However, if power detection circuit 284 determines that the power demand on boost converter 110 is within the threshold of its maximum output power capability, clock boost circuit 280 produces CLOCK2 at a frequency that is higher than that otherwise corresponding to CLOCK1_SEL. In one example, clock generator 286 produces CLOCK2 at a frequency that is double the highest clock frequency that clock generator 286 would otherwise produce based on CLOCK1_SEL if high power detection circuit 284 determines that boost converter 110 is providing power to amplifier 120 that is within the threshold of its maximum output power capability.

The clock signal CLOCK2 from clock boost circuit 280 is provided to PWM generator to generate a PWM IN signal to power stage 250. As described above, boost converter 110 is a peak mode control boost converter. Comparator 220 compares the inductor current sense signal I_IND from power stage 240 to the peak reference current I_LIM_REF, which is generated by current threshold generator 210. When the transistor of power stage 240 (transistor M33 in FIG. 3, described below) is on, the inductor's current increases (e.g., ramps up). When signal I_IND reaches the peak reference current I_LIM_REF, the output signal COMP_OUT from comparator 220 changes logic state from low to high. A logic high assertion of COMP_OUT causes PWM generator 230 to force its output signal PWM_IN to a logic state that turns off transistor M33 (described below) within power stage 240. Transistor M33 turns on again based on an edge (e.g., rising edge) of clock CLOCK2. The boost converter's output voltage PVDD is provided to input 250*a* of V2I converter, which converts the voltage PVDD to a current V2I_OUT. Output current V2I_OUT is proportional to output voltage PVDD. Based on a ripple compensation current COMP from ripple compensation circuit 270, summer 260 produces an output current I_FB, which also is proportional to output voltage PVDD.

In some examples, the maximum current value I_MAX 211 is programmed into boost converter 110, e.g., programmed into a register over a serial interface. In some examples, the maximum current value I_MAX 211 protects the inductor within power stage 240 from receiving a current in excess of its rated value. As described below, current threshold generator 210 generates the peak reference current I_LIM_REF to a value that is equal or less than the maximum current value I_MAX 211. For a given switching frequency of CLOCK2, the magnitude of output voltage PVDD varies inversely with output power—as output power from boost converter 110 increases, PVDD decreases and as output power decreases PVDD decreases. A control loop includes V2I converter 250, summer 260, and current threshold generator 210. The control loop adjusts the magnitude of peak reference current I_LIM_REF based on the magnitude of PVDD. As PVDD decreases, the magnitude of current I_FB decreases and the magnitude of peak reference current I_LIM_REF increases. As PVDD increases, the magnitude of current I_FB increases and the magnitude of peak reference current I_LIM_REF decreases. Accordingly, in some examples, I_LIM_REF being close to I_MAX 211 means that boost converter 110 is supplying close to its maximum power capability. High power detection circuit 284 may compare I_LIM_REF to I_MAX 211 to determine whether boost converter 110 is supplying power close to its maximum power capability.

Figure 3:
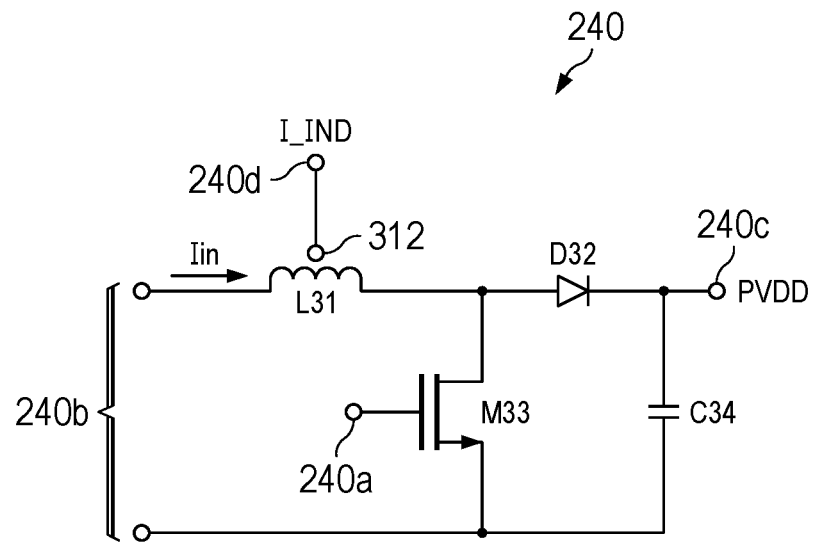
FIG. 3 is a schematic diagram of a power stage of the boost converter of FIG. 1, in an example.

FIG. 3 is a circuit diagram of power stage 240 in one example. Power stage 240 includes an inductor L31, a diode D32, a transistor M33, a capacitor C34, and a current sense circuit 312. Inductor L31 is coupled between input 240*b* and the anode of diode D32. Capacitor C34 and the cathode of diode D32 are coupled to output 240*c*. Transistor M33 is an n-channel field effect transistor (NFET) in this example but can be implemented as another type of transistor in another example. The drain of transistor M33 is coupled to the inductor L31 and the anode of diode D32. The source of transistor M33 and capacitor C34 are coupled together and to the input 240*b*. Current sense circuit 312 is a sense resistor (e.g., 100 milli-ohms) in one example. The sense resistor may be coupled in series with inductor L31. The voltage across the sense resistor is proportional to the current Lin. An amplifier may be included to amplify the voltage across the sense resistor to produce the signal I_IND at the inductor current sense output 240*d*.

Figure 4:
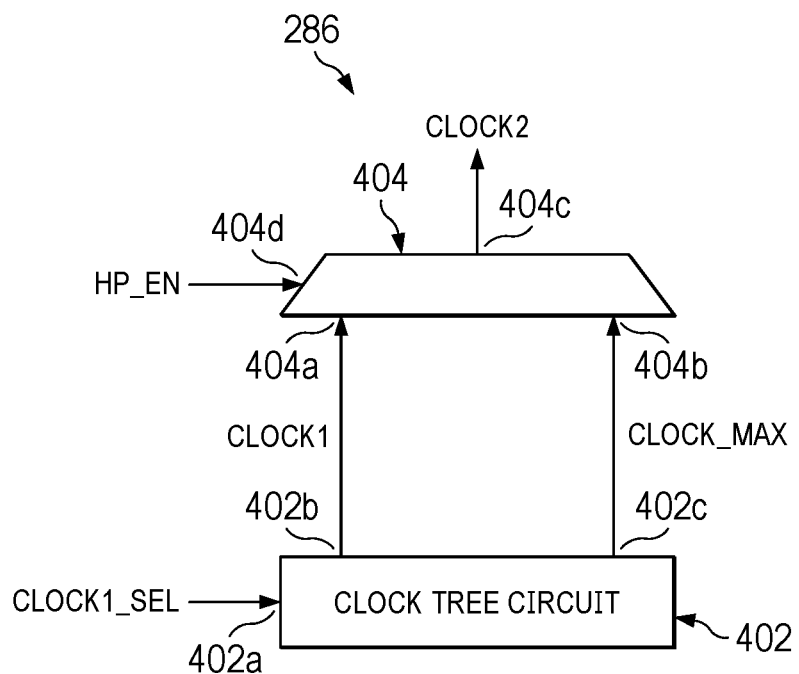
FIG. 4 is a schematic diagram of a clock generator of the boost converter of FIG. 1, in an example.

FIG. 4 is a block diagram of clock generator 286, in an example. Clock generator 286 includes a clock tree circuit 402 and a multiplexer 404. Clock tree circuit 402 has a selection input 402a and clock outputs 402b and 404c. Clock tree circuit 402 generates multiple clock signals at various frequencies, one of which is selected as the output CLOCK1 at clock output 402b based on CLOCK1_SEL. Clock tree circuit 402 produces its highest frequency output clock, CLOCK_MAX, at its output 402c regardless of the value of CLOCK1_SEL. Multiplexer 404 has inputs 4024a and 404b, selection input 404d, and output 404c. HP_EN from high power detection circuit 284 is provided to the multiplexer's selection input 404d. When HP_EN is logic low, multiplexer 404 selects CLOCK1 from clock tree circuit 402 as the output clock CLOCK2. When HP_EN is logic high, multiplexer 404 selects CLOCK_MAX from clock tree circuit 402 as the output clock CLOCK2. In one example, the frequency of CLOCK_MAX is double that of the highest frequency of CLOCK1 that clock tree circuit 402 would output based on CLOCK1_SEL.

Figure 5:
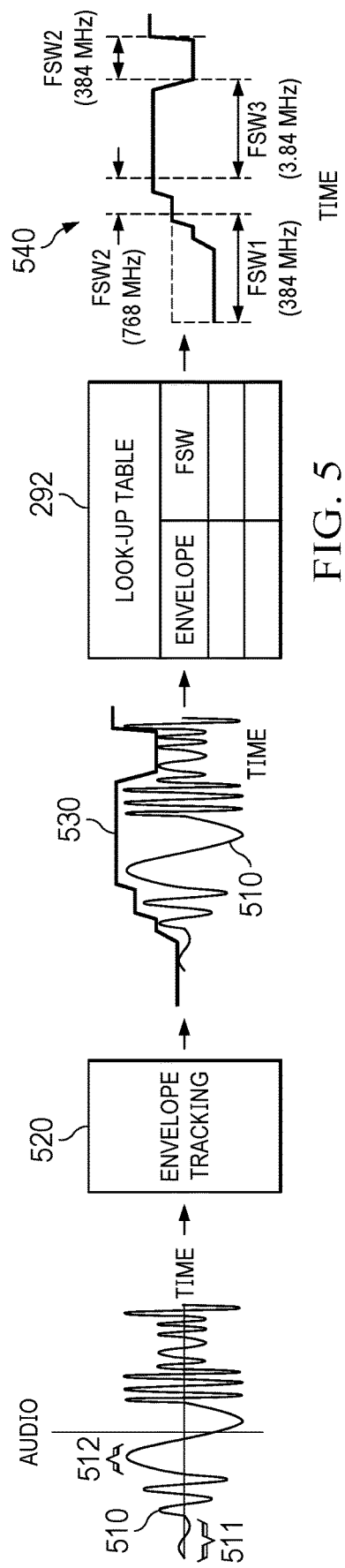
FIG. 5 is a diagram illustrating the operation of an envelope tracker of the boost converter of FIG. 1, in an example.

FIG. 5 is a diagram illustrating the operation of envelope tracker 290. FIG. 5 includes an example input audio signal AUDIO IN 510. In general, audio can be characterized as having a fairly high crest factor. The crest factor is the ratio of the peak magnitude of the audio to its average. A high crest factor audio signal means that the audio signal has extended periods of relatively low amplitude audio 511 as well as short duration, high amplitude peaks 512. At the lower amplitude audio levels 511, amplifier 120 provides relatively low power (e.g., 1 watt) to speaker 140, but at the higher amplitude peaks 512, amplifier 120 provides higher power levels (e.g., 7 watts) to speaker 140. Accordingly, boost converter 110 responds to the changing power demands of amplifier 120 by supplying to amplifier 120 the varying power levels corresponding to the audio signal being played through speaker 140. Envelope tracker 290 implements envelope tracking 520 to generate an envelope 530 of the audio signal 510. Envelope 530 is provided to LUT 292 as an index. LUT 292 maps the envelope value to a switching frequency, Fsw. In one example, LUT 292 includes multiple ranges of envelope values and a different switching frequency mapped to each envelope value range. In one example, boost converter 110 is a synchronous boost converter in which the switching frequencies in LUT 292 are multiple integers of a base switching frequency. In the example of FIG. 5, the base switching frequency is 384 KHz, and the other switching frequencies are integer multiples of 384 KHz. Waveform 540 in FIG. 5 illustrates an example mapping between audio envelope 530 and switching frequencies. Envelope tracker 290 applies a base switching frequency, Fsw1, of 384 KHz to a first audio envelope range, a second switching frequency, Fsw2, of 768 KHz to the next higher envelope range, and a third switching frequency, Fsw3, of 3.84 KHz for the next higher envelope range. In this example, the envelope of the audio signal 510 is divided into three bins and a different switching frequency is mapped to each of the three bins. Other examples may have fewer or more than three bins and, accordingly, fewer or more than three switching frequencies. The frequency of CLOCK1 from envelope tracker 290 is one of the frequencies from LUT 292 and is based on the bin corresponding to the audio envelope 530. Envelope tracker 290 also may generate signal 293 to a logic state for an audio envelope below a relatively low threshold to cause switch SW1 to couple VIN directly to the output 112 of power stage 240 thereby bypassing the power stage of boost converter 110.

Figure 6:
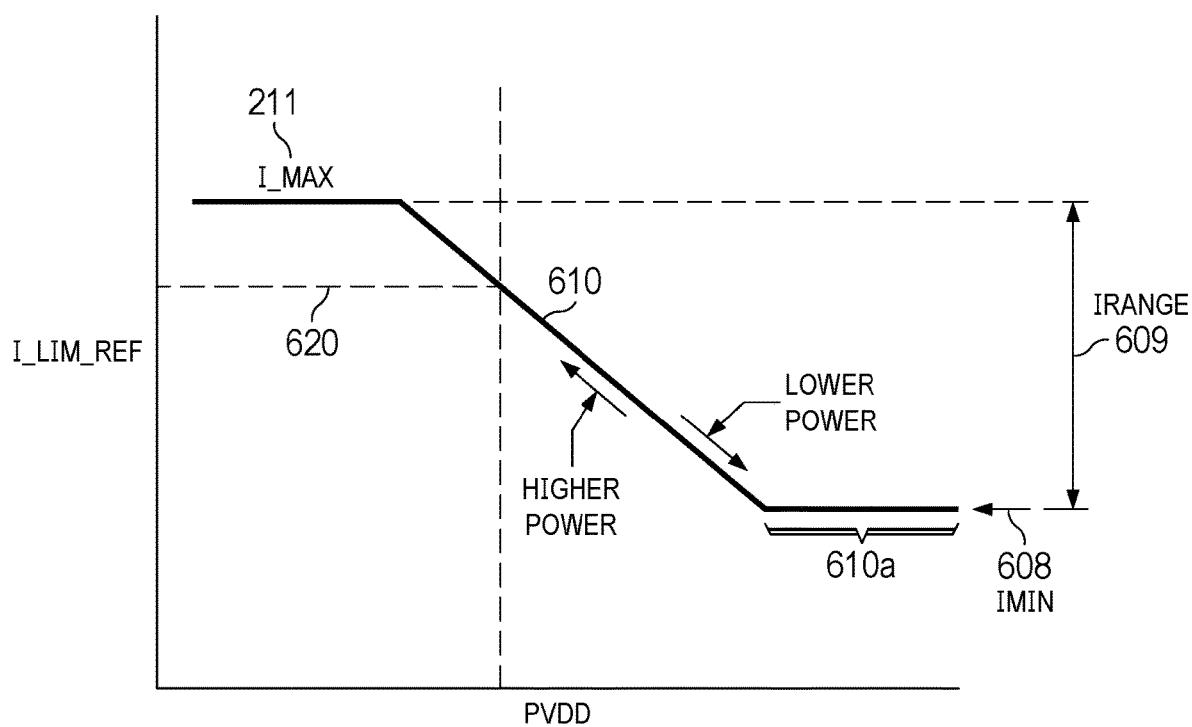
FIG. 6 is a graph illustrating the relationship between the peak reference current of the boost converter of FIG. 1 and its output voltage.

FIG. 6 is a graph 610 of the peak reference current, I_LIM_REF, versus voltage PVDD from boost converter 110. As described above, for a given switching frequency, PVDD varies inversely with output power. FIG. 6 illustrates that as the power draw from boost converter 110 increases, voltage PVDD decreases, and as the power draw decreases, voltage PVDD increases. Further, as described above, boost converter increases the level of the peak reference current I_LIM_REF as PVDD decreases/power draw increases. High power detection circuit 284 determines when the peak reference current I_LIM_REF reaches or exceeds a threshold 620, which is close to the maximum current I_MAX 211. In response to determining that the peak reference current I_LIM_REF reaches or exceeds threshold 620 (is within the threshold noted above of I_MAX 211), high power detection circuit 284 asserts output signal HP ENABLE 295 to, for example, a logic high state. Clock generator 286 responds to a logic high assertion of output signal HP ENABLE 295 by increasing, e.g., doubling, the switching frequency of CLOCK2 to PWM generator 230 from the highest switching frequency that otherwise would have been provided based on CLOCK1_SEL. High power detection circuit 284 asserts output signal HP ENABLE 295 to the logic high state commensurate with audio signal 510 (FIG. 5) being at or near a high amplitude peak 512. Clock generator 286 responds by changing the state of multiplexer 404 to select CLOCK_MAXC at input 404b as its CLOCK2 for the high amplitude audio peaks to provide increased power to amplifier 120. As the power draw on boost converter 110 decreases, peak reference current I_LIM_REF also decreases below threshold 620, and high power detection circuit 284 forces its output signal HP ENABLE 295 to, for example, a logic low state. The output signal HP ENABLE 295 being at a logic low state causes clock generator 286 to change the state of multiplexer 404 to select CLOCK1 from clock tree circuit 402 as its output clock CLOCK2 thereby providing CLOCK2 to PWM generator 230 at a frequency based on LUT 292. Graph 610 includes a flat region 610a at an I_LIM_REF current level equal to IMIN 608. FIG. 6 also illustrates that the difference between I_MAX 211 and IMIN is a current IRANGE 609. Currents IMIN and IRANGE are further explained below with reference to FIG. 7.

Figure 7:
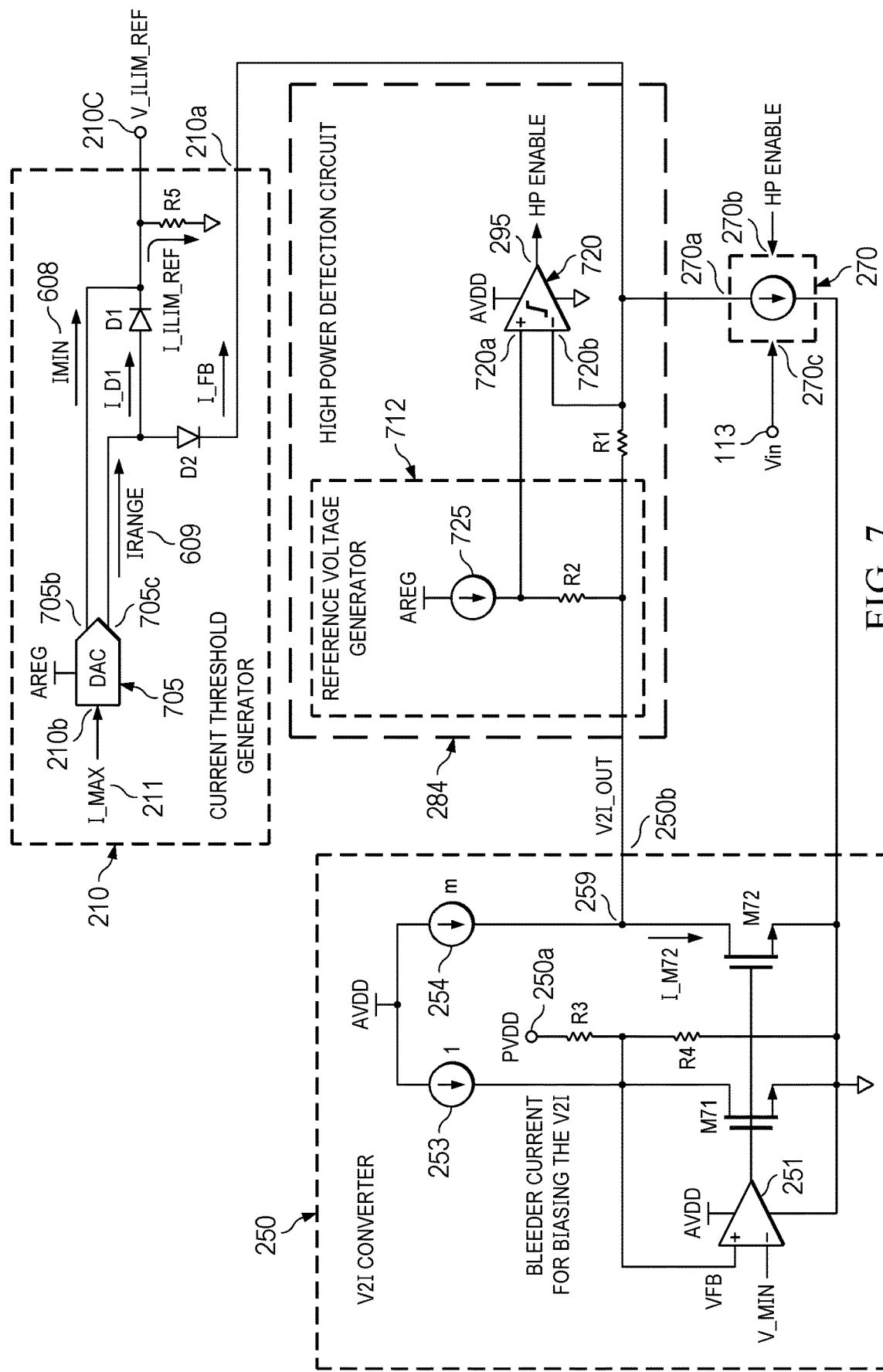
FIG. 7 is a schematic diagram of at least a portion of the boost converter of FIG. 1, in an example.

FIG. 7 is a circuit schematic illustrating example implementations of V2I converter 250, high power detection circuit 284, and current threshold generator 210. The V2I converter 250 includes an amplifier 251, transistors M71 and M72, resistors R3 and R4, and current sources 253 and 254. Resistors R3 and R4 are coupled in series between input 250a and ground thereby forming a voltage divider for voltage PVDD. The connection between resistors R3 and R4 is coupled to the positive input of amplifier 251, and the negative input of amplifier 251 receives a reference voltage, V_MIN. The output of amplifier M71 is coupled to the gates of transistors M71 and M72. The sources of transistors M71 and M72 are coupled to ground. Current source 253 is coupled to the drain of transistor M71 and to the positive input of amplifier 251, and current source 254 is coupled to the drain of transistor M72 and to the output 250b at node 259. Current sources 253 and 254 provide current for biasing V2I converter 250.

High power detection circuit 284 includes a reference voltage generator 712, a resistor R1, and a comparator 720. Reference voltage generator 712 includes a current source 725 coupled to a resistor R2 and to the positive input of comparator 720. Resistor R1 is coupled between output 250b and the negative input of comparator 720. Comparator 720 generates the output signal HP ENABLE 295 at its output.

Current threshold generator 210 includes a digital-to-analog converter (DAC) 705, diodes D1 and D2, and a resistor R5. The input of DAC 705 is the input 210b noted above and receives a digital value representing the maximum current I_MAX 211. DAC 705 has outputs 705b and 705c, each providing a current. Output 705b provides current IMIN 608, and output 705c provides current IRANGE 609. The anodes of diodes D1 and D2 are coupled to output 705c of DAC 705. The cathode of diode D1 is coupled to output 705b and to output 210c.

Resistor R5 is coupled between output 210c and ground. The block diagram of FIG. 2 shows the peak reference current I_LIM_REF flowing into the negative input of comparator 220. In the example implementation of FIG. 7, the peak reference current I_LIM_REF flows through resistor R5 thereby generating a voltage V_ILIM_REF which is proportional to peak reference current I_LIM_REF. In one example, comparator 220 is a voltage comparator and its input signals are voltages. Accordingly, peak reference current I_LIM_REF is converted to a voltage by resistor R5. Similarly, the signal I_IND indicative of the current through inductor L31 of power stage 240 also is a voltage indicative of the current through inductor L31.

The current through resistor R5 is equal to or greater than current IMIN 608, thereby setting the minimum current level IMIN for the peak reference current I_LIM_REF. Current IRANGE 609 can flow through diode D1, through diode D2, or divide between diodes D1 and D2. The current through diode D1 is current I_D1, and the current through diode D2 is current I_FB. Accordingly, the sum of currents I_FB and I_D1 is current IRANGE 609. The larger is current I_FB, the smaller is current I_D1, and the smaller is current I_FB, the larger is current I_D1. The sum of currents I_D1 and IMIN 609 is peak reference current I_LIM_REF. Accordingly, an increase in current I_FB causes a decrease in peak reference current I_LIM_REF, and a decrease in current I_FB causes a decrease in in peak reference current I_LIM_REF.

The V2I converter 250 sets the magnitude of current I_FB. The current from current source 254 and current I_FB flow into node 259, and current I_M72 flows from node 259 and through transistor M72. Accordingly, the sum of the current from current source 254 and current I_FB equals current I_M72. The current from current source 254 is a fixed current. The current I_M72 is set by the gate-to-source voltage (Vgs) of transistor M72. The Vgs of transistor M72 is the voltage at the output of amplifier 251, and amplifier 251 amplifies the difference between voltages VFB and V_MIN. Because voltage VFB is proportional to voltage PVDD, the Vgs of transistor M72 is proportional to voltage PVDD. Accordingly, current I_M72 is proportional to voltage PVDD. Because the currents at node 259 must balance, as voltage PVDD decreases, current I_M72 also decreases and current I_FB decreases. Similarly, as voltage PVDD increases, current I_M72 increases and current I_FB increases. Accordingly, current I_FB is proportional to voltage PVDD. As voltage PVDD decreases, current I_FB decreases and current I_D1 increases causing peak reference current I_LIM_REF to increase. When voltage PVDD decreases to the point that it is equal to or less than voltage VMIN, transistor M72 turns off, current I_FB is 0 amperes, and peak reference current I_LIM_REF equals the sum of currents IRANGE 608 and IMIN 608, which is the maximum current I_MAX. As voltage PVDD increases, current I_FB increases and current I_D1 decreases causing peak reference current I_LIM_REF to decrease.

Relative to the voltage at output 250b, comparator 720 compares the voltage across resistor R2 to the voltage across resistor R1. The voltage across resistor R2 is a fixed reference voltage set by the current from current source 725. The voltage across resistor R1 is set by the current I_FB flowing through resistor R1. As described above, current I_FB is inversely related to the peak reference current I_LIM_REF. When the peak reference current I_LIM_REF is less than threshold 620 (FIG. 6), current I_FB is large enough that the voltage on the negative input of comparator 720 is larger than the fixed reference voltage across resistor R2, and output signal HP ENABLE 295 is logic low. However, when the peak reference current I_LIM_REF reaches the threshold 620, current I_FB is smaller enough that the voltage on the negative input of comparator 720 is smaller than the fixed reference voltage across resistor R2, thereby causing comparator 720 to force output signal HP ENABLE 295 to a logic high state.

When high power detection circuit 284 determines that peak reference current I_LIM_REF is at or above threshold 620 (FIG. 6), high power detection circuit 284 asserts its output signal HP ENABLE 295 to a logic high state thereby causing clock generator 286 to increase the switching frequency of boost converter 110. When that happens, the magnitude of the ripple current decreases and, for the same level of peak reference current I_LIM_REF, the average inductor current increases. A sudden increase in average inductor current causes a sudden jump in voltage PVDD, which may cause audio artefacts in the audio produced by speaker 140. Ripple compensation circuit 270 addresses this problem.

Figure 8:
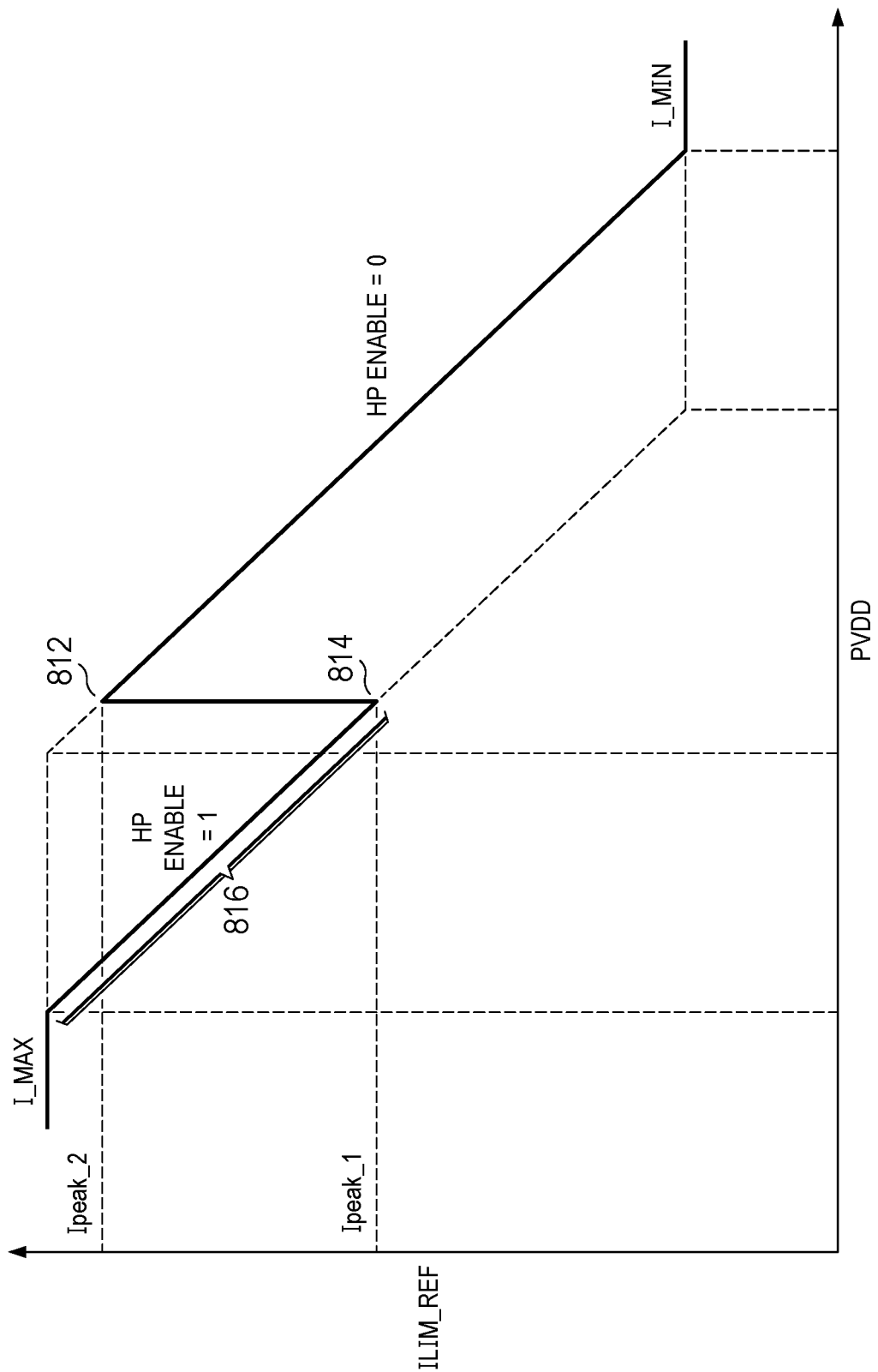
FIG. 8 is a graph of the relationship between the peak reference current of the boost converter of FIG. 1 and its output voltage illustrating the operation of a ripple compensation circuit, in an example.

FIG. 8 is a graph 810 of peak reference current I_LIM_REF versus voltage PVDD with the use of ripple compensation circuit 270. As the level of the peak reference current I_LIM_REF reaches an upper threshold Ipeak_2 at point 812, ripple compensation circuit 270, which also receives the signal HP ENABLE 295 responds to the positive assertion of signal HP ENABLE 295 by causing a sudden decrease in peak reference current I_LIM_REF from Ipeak_2 down to Ipeak_1. Although the switching frequency of boost converter 110 suddenly increases, because its peak reference current I_LIM_REF suddenly decreases down to threshold Ipeak_1, the average inductor current before and after the sudden change in switching frequency remains approximately the same. The peak reference current I_LIM_REF may continue increasing along segment 816 if the load on boost converter 110 continues to increase. As the load on boost converter 110 decreases, peak reference current I_LIM_REF eventually drops to point 814. At that point, high power detection circuit 284 forces signal HP ENABLE 195 back to a logic 0 state which causes clock generator 286 to reduce the switching frequency of CLOCK2, e.g., by a factor of 2, and causes ripple compensation circuit 270 to increase peak reference current I_LIM_REF back to threshold Ipeak_2 thereby resulting in a negligible sudden step in the average inductor current.

Figure 9:
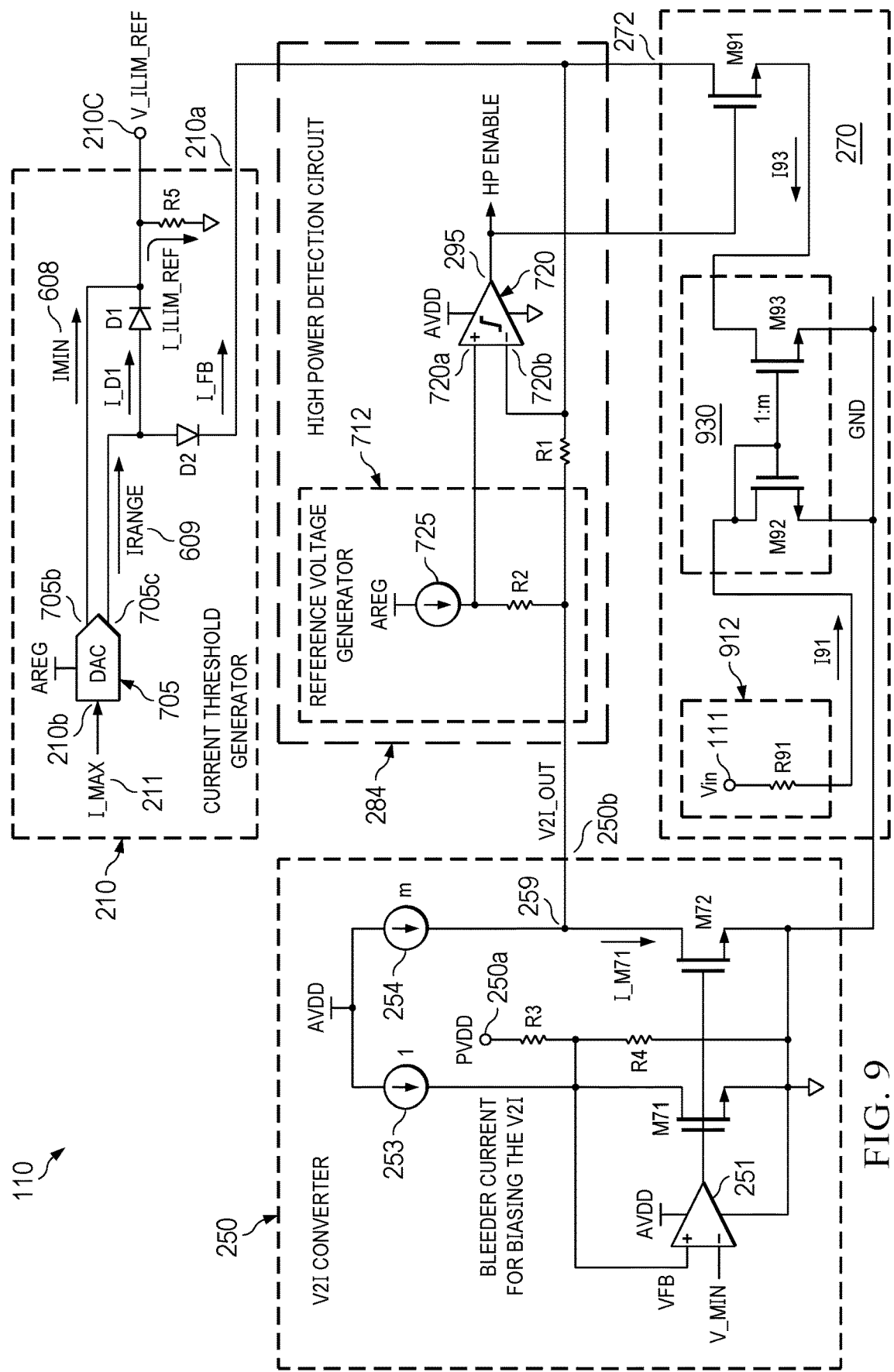
FIG. 9 is a schematic diagram of at least a portion of the boost converter of FIG. 1, in another example.

FIG. 9 is the same circuit schematic as in FIG. 7 but includes an example circuit implementation of ripple compensation circuit 270. Ripple compensation circuit 270 includes a current source circuit 912, a current mirror 930, and a transistor M91. Current source circuit 912 includes resistor R91. Current mirror 930 includes transistors M92 and M93. The current mirror ratio of current mirror 930 is 1:m where m is an integer equal to or greater than 1. Transistors M91-N93 are NFETs in this example. The gates of transistors M92 and M93 are coupled together and to the drain of transistor M92. The sources of transistors M92 and M93 are coupled together at ground. Current source circuit 912 is coupled between input voltage terminal 11 and the drain of transistor M92. The source of transistor M91 is coupled to the drain of transistor M93, and the drain of transistor M91 is coupled to output 272. The gate of transistor M91 is coupled to the output of comparator 720 and, accordingly, receives signal HP ENABLE 295. Signal HP ENABLE 295 turns on transistor M91 when it is logic high and turns off transistor M91 when it is logic low.

The current I91 through resistor R91, which also flows through transistor M92 is based on the magnitude of input voltage Vin and the resistance of resistor R91. When signal HP ENABLE 295 is logic high, current I91 is mirrored through transistor M93 as current I93, which also causes an increase in current I_FB. An increase in current I_FB due to transistor M91 turning on causes a commensurate decrease in peak reference current I_LIM_REF corresponding to the drop in the peak reference current I_LIM_REF from threshold Ipeak_2 to I_peak1 (FIG. 8). If the load on boost converter 110 decreases and high-power detection circuit 284 de-asserts signal HP ENABLE 295 from logic 1 to logic 0, transistor M91 turns off thereby causing a decrease in current I_FB and an commensurate increase in peak reference current I_LIM_REF corresponding to the increase in the peak reference current I_LIM_REF from threshold I_peak1 to I_peak2.

Figure 10:
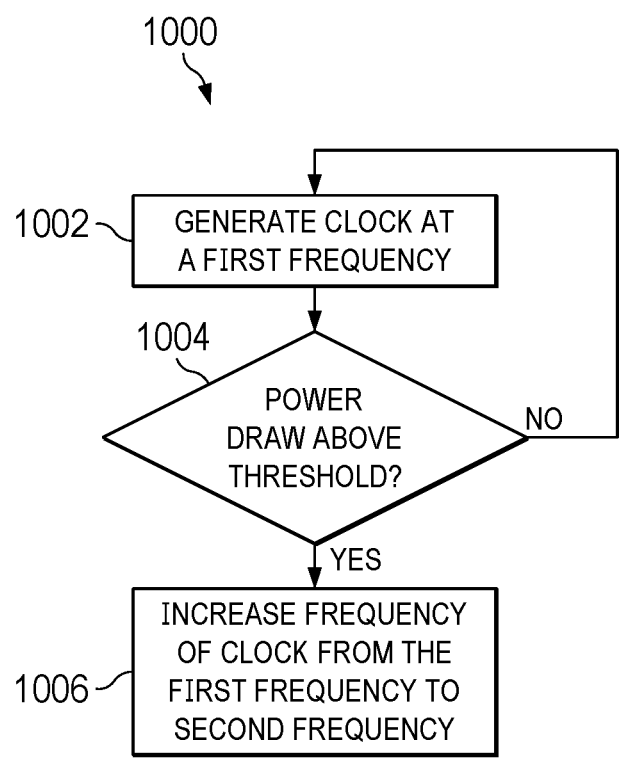
FIG. 10 is a flow diagram illustrating the operation of the boost converter of FIG. 1, in an example.

FIG. 10 is a flow diagram 1000 illustrating the operation of boost converter 110 in an example. At operation 1002, boost converter 1002 generates a clock at a first frequency. The clock in operation 1002 may be generated by clock generator 286 based on the magnitude of the envelope of AUDIO IN and provided to the PWM generator 230. At decision operation 1004, boost converter 110 determines whether its power draw is above a threshold. For example, high power detection circuit 284 may determine whether the peak reference current I_LIM_REF is within a threshold of the maximum current I_MAX permitted for the boost converter. If the power draw is above the threshold (the "Y" branch from decision operation 1004), then operation 1006 is performed at which the frequency of the clock signal is increased from the first frequency to a second frequency. In one example, the second frequency may be double that of the first frequency. Otherwise, if the power draw is not above the threshold (the "N" branch), then control loops back to operation 1002.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit, comprising:
    a digital-to-analog converter (DAC) having a first terminal and a second terminal;
    a first diode having a first terminal coupled to the second terminal of the DAC and having a second terminal coupled to the first terminal of the DAC;
    a comparator having a first terminal and a second terminal;
    a second diode having a first terminal coupled to the second terminal of the DAC and having a second terminal coupled to the second terminal of the comparator;
    a voltage-to-current (V2I) converter having a terminal; and
    a resistor having a first terminal coupled to the second terminal of the second diode and having a second terminal coupled to the terminal of the V2I converter.

2. The circuit of claim 1, wherein the first terminal of the first diode is the anode of the first diode, the second terminal of the first diode is the cathode of the first diode, the first terminal of the second diode is the anode of the second diode, and the second terminal of the second diode is the cathode of the second diode.

3. The circuit of claim 1, wherein:
    the DAC has a third terminal configured to receive a digital value; and
    the DAC generates a first current at the first terminal of the DAC and a second current at the second terminal of the DAC, and the sum of the first and second currents is based on the digital value.

4. The circuit of claim 1, further comprising a reference voltage generator coupled to the first terminal of the comparator.

5. The circuit of claim 4, wherein the resistor is a first resistor, and the reference voltage generator includes a current source circuit coupled in series with a second resistor.

6. The circuit of claim 1, further comprising a ripple compensation circuit having a terminal coupled to the second terminal of the second diode.

7. The circuit of claim 6, wherein the comparator has a third terminal, and the ripple compensation circuit comprises:
    a first transistor having a first terminal, a second terminal, and a third terminal, the first terminal coupled to the third terminal of the comparator, the second terminal of the transistor coupled to the terminal of the ripple compensation circuit;
    a current mirror having a first terminal and a second terminal, the second terminal of the current mirror coupled to the third terminal of the first transistor; and
    a current source circuit coupled to the first terminal of the current mirror.

8. A boost converter, comprising:
    a power stage having a power stage input;
    a pulse width modulation (PWM) generator having a PWM input, a PWM clock input, and a PWM output, the PWM output coupled to the power stage input;
    a comparator having a first input, a second input, and an output, the output of the comparator coupled to the PWM input;
    a current threshold generator having a current threshold output coupled to the first input of the comparator; and
    a clock boost circuit having a clock output coupled to the PWM clock input, the clock boost circuit configured to cause an increase of a frequency of a clock signal at the clock output responsive to a determination that a magnitude of a power delivered by the boost converter has exceeded a threshold.

9. The boost converter of claim 8, wherein the clock boost circuit includes:
    a comparator configured to compare a reference signal to a second signal based on an output voltage of the boost converter, the comparator having an output; and
    a clock generator having a control input coupled to the output of the comparator.

10. The boost converter of claim 9, wherein the clock generator has a second input, and the boost converter further comprises an envelope tracker having an output and configured to produce a clock selection signal at the output of the envelope tracker based on an amplitude of an audio signal, the output of the envelope tracker coupled to the second input of the clock generator.

11. The boost converter of claim 8, wherein the current threshold generator is configured to generate a peak current threshold signal, the comparator is a first comparator, and the clock boost circuit includes:
    a second comparator that is configured to compare a reference voltage to a second voltage, the second voltage based on the peak current threshold signal.

12. The boost converter of claim 11, wherein;
    the current threshold generator includes a digital-to-analog converter (DAC) having a first terminal and a second terminal, a first diode having a first terminal coupled to the second terminal of the DAC and having a second terminal coupled to the first terminal of the DAC, a second diode having a first terminal coupled to the second terminal of the DAC and having a second terminal coupled to a terminal of the second comparator; and
    the clock boost circuit includes:
        a voltage-to-current (V2I) converter having a terminal; and
        a resistor having a first terminal coupled to the second terminal of the second diode and having a second terminal coupled to the terminal of the V2I converter.

13. The boost converter of claim 12, wherein the terminal of the V2I converter is a first terminal, and the V2I converter has a second terminal coupled to an output of the boost converter, and the V2I converter is configured to generate a current based on a voltage at the output of the boost converter.

14. The boost converter of claim 12, wherein the first terminal of the first diode is the anode of the first diode, the second terminal of the first diode is the cathode of the first diode, the first terminal of the second diode is the anode of the second diode, and the second terminal of the second diode is the cathode of the second diode.

15. The boost converter of claim 12, wherein the second comparator has a first input and a second input, and the clock boost circuit includes a reference voltage generator coupled to the first input of the second comparator.

16. The boost converter of claim 11, wherein the second comparator has an output, and the boost converter further comprises a ripple compensation circuit having a control input coupled to the output of the second comparator.

17. The boost converter of claim 16, wherein the second comparator has an input, and the ripple compensation circuit comprises:
- a first transistor having a first terminal, a second terminal, and a third terminal, the first terminal of the first transistor being the control input of the ripple compensation circuit, the second terminal of the first transistor coupled to the input of the second comparator;
- a current mirror having a first terminal and a second terminal, the second terminal of the current mirror coupled to the third terminal of the first transistor; and
- a current source circuit coupled to the first terminal of the current mirror.

18. An audio system, comprising:
- an audio amplifier having a first terminal and a second terminal; and
- a peak current mode boost converter having a first terminal coupled to the first terminal of the audio amplifier, the peak current mode boost converter configured to:
  - generate a clock at a first frequency;
  - determine that a power draw by the audio amplifier is above a threshold; and
  - responsive to the determination that the power draw is above the threshold, increase the frequency of the clock from the first frequency to a second frequency.

19. The audio system of claim 18, wherein the peak current mode boost converter is configured to determine that the power draw by the audio amplifier is above the threshold by comparing a reference signal to a second signal based on an output voltage of the boost converter.

20. The audio system of claim 18, wherein the second frequency is twice the first frequency.

21. The audio system of claim 18, further comprising a speaker coupled to the second terminal of the audio amplifier.

* * * * *